United States Patent [19]

Yamaguchi et al.

[11] Patent Number: 5,576,565
[45] Date of Patent: Nov. 19, 1996

[54] MIS CAPACITOR AND A SEMICONDUCTOR DEVICE UTILIZING SAID MIS CAPACITOR

[75] Inventors: Seiji Yamaguchi; Tsuguyasu Hatsuda, both of Osaka; Ichirou Matsuo, Kyoto, all of Japan

[73] Assignee: Matsushita Electric Industrial Co., Ltd., Osaka, Japan

[21] Appl. No.: 220,282

[22] Filed: Mar. 30, 1994

[30] Foreign Application Priority Data

Mar. 31, 1993 [JP] Japan ..................... 5-073166

[51] Int. Cl.⁶ .................. H01L 27/108; H01L 29/76; H01L 21/70
[52] U.S. Cl. .................. 257/296; 257/300; 257/306; 437/52
[58] Field of Search .................. 257/296, 532, 257/300, 306, 213, 360; 437/52

[56] References Cited

U.S. PATENT DOCUMENTS

| | | | |
|---|---|---|---|
| 3,911,466 | 10/1975 | Lattin | 357/23 |
| 4,704,625 | 11/1987 | Lee | 357/51 |
| 4,720,467 | 1/1988 | Muggli et al. | 437/52 |
| 5,329,138 | 7/1994 | Mitani et al. | 257/296 |
| 5,436,484 | 7/1995 | Iwai et al. | 257/360 |

FOREIGN PATENT DOCUMENTS

| | | |
|---|---|---|
| 59-23569 | 2/1984 | Japan . |
| 3-74867 | 3/1991 | Japan . |
| 4-37070 | 2/1992 | Japan . |

*Primary Examiner*—Jerome Jackson
*Assistant Examiner*—Valencia Martin Wallace
*Attorney, Agent, or Firm*—McDermott, Will & Emery

[57] ABSTRACT

The present invention discloses the structure of a MIS capacitor adapted to be interposed between two terminals, i.e., first and second terminals, to be connected to an electric circuit. Formed on a common semiconductor substrate are first and second capacity insulator layers, first and second electrically conductive layers thereon, and first and second impurity diffusion areas under the first and second capacity insulator layers. Also formed are a first wiring line which connects the first electrically conductive layer and the second impurity diffusion area to the first terminal, and a second wiring line which connects the second electrically conductive layer and the first impurity diffusion area to the second terminal. Accordingly, the first electrically conductive layer and the second impurity diffusion area form one electrode, while the second electrically conductive layer and the first impurity diffusion area form the other electrode. With the arrangement above-mentioned, voltage dependencies inherent in capacitors each having a MIS structure are substantially cancelled with each other, resulting in reduction of the voltage dependency of the MIS capacitor. Through a process using one polysilicon layer, there can be formed an economical MIS capacitor having a small area which can be mounted on an analog circuit.

13 Claims, 6 Drawing Sheets

1. Silicon Substrate
2. Active Area
3. Isolating Member
11. First Impurity Diffusion Area
12. Second Impurity Diffusion Area
21. First Capacity Insulator Layer
22. Second Capacity Insulator Layer
31. First Polisilicon Electrode
32. Second Polisilicon Electrode
51. First Wiring Line
52. Second Wiring Line
61. First Terminal
62. Second Terminal

MIS CAPACITOR AND A SEMICONDUCTOR DEVICE UTILIZING SAID MIS CAPACITOR

BACKGROUND OF THE INVENTION

The present invention relates to a MIS capacitor having a so-called MIS structure (Metal-Insulator-Semiconductor), and to a semiconductor device on which mounted are such a MIS capacitor and a MIS transistor. More particularly, the present invention relates to measures for improving such a MIS capacitor in characteristics and for simplifying the production of such a semiconductor device.

As disclosed in U.S. Pat. No. 4,720,467 for example, there is known a MIS capacitor comprising an insulator layer formed on a semiconductor substrate, a polysilicon electrode on the insulator layer and an impurity diffusion area formed on that surface area of the semiconductor substrate which is located at a lateral side of the polysilicon electrode. More specifically, the polysilicon electrode serves as one electrode of the MIS capacitor, the impurity diffusion area serves as the other electrode of the MIS capacitor, and the insulator layer serves as an electric charge accumulating member.

There is also known an example of a capacitor having another structure in which two polysilicon layers are used. Such a capacitor is arranged such that an interlaminar insulator layer having a thickness of tens nm is interposed between two polysilicon layers, and that the polysilicon layers serve as two opposite electrodes and the interlaminar insulator layer serves as an electric charge accumulating member.

There is also known an example of a capacitor having still another structure in which two metal layers and one polysilicon layer are used. More specifically, there are formed, on a semiconductor substrate, two metal layers by and between which a polysilicon layer is held, and an insulator layer having a thickness of hundreds nm is interposed between the polysilicon layer and each metal layer.

PROBLEMS TO BE SOLVED BY THE INVENTION

Conventional capacitors having structures as above-mentioned present the following problems.

In a capacitor having the MIS-capacitor structure above-mentioned, the voltage dependency of a capacity value (the amount of change in capacity value with respect to variations of a voltage) is disadvantageously great.

Figure 8:
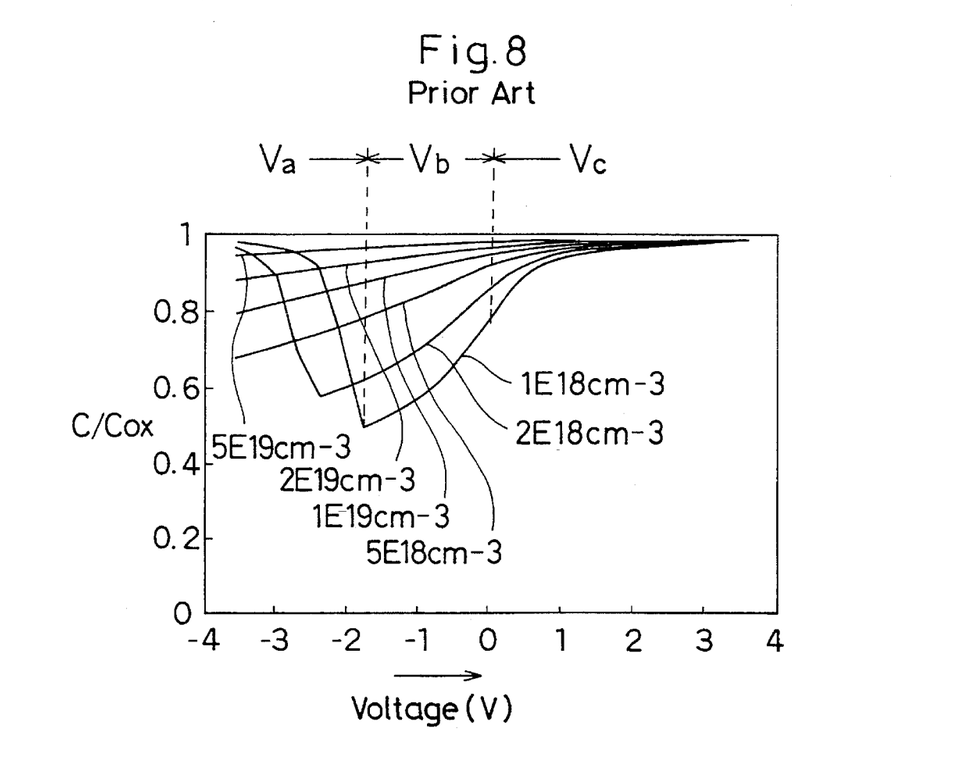
FIG. 8 is a characteristic view illustrating the voltage dependency of a capacity value of a conventional MIS capacitor.

The following description will discuss the characteristics of a usual MIS capacitor. FIG. 8 shows variations of a capacity value with respect to variations of a voltage V applied to a polysilicon electrode of a MIS capacitor, i.e., the voltage dependency of a capacity value. Here, it is to be noted that a capacity value is expressed in terms of an effective capacity ratio C/Cox as obtained by dividing an effective capacity value C by a theoretical capacity value Cox. The theoretical capacity value Cox is a capacity value as obtained by multiplying the permittivity, thickness and area of a silicon oxide layer, and the effective capacity value C is a capacity value as obtained at the time the MIS capacitor is actually operated on an electric circuit. It is also noted that the data in FIG. 8 are those obtained when impurity ions were injected into the impurity diffusion area simultaneously with the injection of N-type impurity into a depletion-type transistor. Further, FIG. 8 shows the voltage dependency of a capacity value when the impurity concentration in the impurity diffusion area underwent a change from $1E18$ $cm^{-3}$ to $5E19$ $cm^{-3}$.

With reference to FIG. 8, the following description will discuss variations of a capacity value when the impurity concentration in the impurity diffusion area is equal to $1E18$ $cm^{-3}$ for example. In a zone Vc where the voltage applied to the polysilicon electrode is not less than 0 V, the effective capacity ratio C/Cox gets closer to 1 with an increase in voltage. On the other hand, in a zone Vb where the voltage is between about 0 V and about $-2$ V, the effective capacity ratio C/Cox is lowered and reaches a value as small as about 0.5 with a decrease in voltage. In a zone Va where the voltage is not greater than $-2$ V, the effective capacity ratio C/Cox is increased and gets closer to 1 with a decrease in voltage. It is presumed that, when the impurity diffusion area is doped with N-type impurity, an inversion layer is formed in the impurity diffusion area in the zone Vc where the voltage is not less than 0 V, that a depletion layer is formed in the impurity diffusion area in the zone Vb where the voltage is between about 0 V and about $-2$ V, and that the effect produced by accumulation of electric charge becomes great in the zone Va where the voltage is not greater than $-2$ V.

Unlike a capacitor in which each of two opposite electrodes is made of a highly electrically conductive substance such as metal or the like, a MIS capacitor has one electrode formed by the impurity diffusion area on the semiconductor substrate. Accordingly, the inner condition of the impurity diffusion area itself varies with a voltage applied to the polysilicon electrode. This causes a capacity value to present voltage dependency as above-mentioned. When used as a part of an analog circuit for example, such a MIS capacitor may provoke distortion or the like. Accordingly, such a MIS capacitor often cannot actually be used as it is.

On the other hand, a capacitor using two polysilicon layers and an inter laminar insulator layer, is lowered in the voltage dependency of a capacity value, but is disadvantageously increased in cost. More specifically, as compared with a usual process requiring the formation of only one polysilicon layer, a process requiring the formation of two polysilicon layers is increased in the number of masks used in photolithography, the number of steps and a period of time required for accomplishing the process.

A capacitor using two metal layers and one polysilicon layer, can be greatly reduced in the voltage dependency of a capacity value, but disadvantageously requires a great area for obtaining a great capacity value. For example, for obtaining the same capacity value with the use of a capacitor using two polysilicon layers and with the use of a capacitor using two metal layers and one polysilicon layer, the area ratio becomes about 1:50 to about 1:100.

To avoid an increase in the area of a semiconductor chip, it is inevitably required to form, on a semiconductor substrate, a capacitor using two polysilicon layers and an interlaminar insulator layer in order to minimize the voltage dependency of a capacity value. Accordingly, when selecting a CMOS process for forming a MOS transistor to be mounted on the same semiconductor substrate, it is inevitably required to adopt an expensive CMOS process of the type where two polysilicon layers are formed.

SUMMARY OF THE INVENTION

It is an object of the present invention to provide a MIS capacitor having a MIS structure provided with means arranged such that the voltage dependency of a capacity value is effectively lowered to obtain excellent electric characteristics without an increase in area required for the MIS capacitor.

To achieve the object above-mentioned, the present invention provides the following means.

A MIS capacitor adapted to be interposed between two terminals, i.e., first and second terminals, to be connected to an electric circuit, comprises, as a basic arrangement: first and second capacity insulator layers formed on a common semiconductor substrate; first and second electrically conductive layers respectively formed on the first and second capacity insulator layers: first and second impurity diffusion areas formed by introducing impurities of the same electrically conductive type, into those portions of the semiconductor substrate which are located under the first and second capacity insulator layers; a first wiring line which connects the first electrically conductive layer and the second impurity diffusion area to the first terminal; and a second wiring line which connects the second electrically conductive layer and the first impurity diffusion area to the second terminal.

According to the arrangement above-mentioned, in the MIS capacitor formed between the first and second terminals, the first electrically conductive layer and the second impurity diffusion area serve as one electrode, and the second electrically conductive layer and the first impurity diffusion area serve as the other electrode. Further, the first and second capacity insulator layers are disposed in parallel with each other, thus forming an electric charge accumulating member. It is now supposed that an AC voltage is applied to the electrically conductive layers of the MIS capacitor. For example, when the potential of the first electrically conductive layer is positive, the potential of the second electrically conductive layer is negative and the absolute values of the both electrically conductive layers are equal to each other. Accordingly, the voltage dependencies of capacity values inherent in capacitors each having a MIS structure are substantially cancelled with each other, resulting in reduction in the voltage dependency of a capacity value of the MIS capacitor in its entirety. Since the voltage dependency of a capacity value is small, the MIS capacitor does not produce a great distortion in the electric circuit. This enables the MIS capacitor to be mounted, as a capacitor, on an analog circuit.

According to the present invention, the MIS capacitor may have any of the following preferable arrangements.

Introduced into the first and second impurity diffusion areas is impurity of the type reverse in electrical conduction to the impurity introduced into the semiconductor substrate. More preferably, the first and second impurity diffusion areas are formed in wells formed in the semiconductor substrate. This securely electrically insulates the semiconductor substrate from the impurity diffusion areas.

Each of the impurity diffusion areas comprises (i) a center portion formed by introduction of impurity into that portion of the semiconductor substrate which is located under each of the electrically conductive layers, and (ii) two lateral portions formed by introduction of impurity into those portions of the semiconductor substrate which are located at both lateral sides of each of the electrically conductive layers, and each of the wiring lines comes in contact with the two lateral portions of each of the impurity diffusion areas. According to such an arrangement, it is possible to form the impurity diffusion areas of the MIS capacitor through a standard process to be used for forming a MIS transistor on the same semiconductor substrate on which the MIS capacitor is formed. It is therefore possible to form a MIS capacitor excellent in characteristics without the number of production steps increased.

The semiconductor substrate may be formed by a semiconductor layer deposited on an insulator. According to this arrangement, a MIS capacitor having a so-called SOI structure is formed, thus providing excellent characteristics with a small parasitic capacity.

Each of the first and second capacity insulator layers, each of the first and second electrically conductive layers and each of the first and second impurity diffusion areas may be disposed in the same plural numbers. In such a case, there can be readily formed a MIS capacitor having a variety of capacity values.

The present invention provides, as another means, a semiconductor device comprising, on the same semiconductor substrate, (i) a MIS capacitor having the basic arrangement above-mentioned, and (ii) a MIS transistor having a gate electrode, a gate insulator layer, a channel area and source/drain areas. In this means, the capacity insulator layers of the MIS capacitor and the gate insulator layer of the MIS transistor are formed by silicon oxide layers which are simultaneously formed.

According to this arrangement, the use of the silicon oxide layers excellent in thickness controllability improves the MIS capacitor in voltage dependency of a capacity value and the like, and the space required for the MIS capacitor can be reduced.

According to the present invention, the semiconductor device having the basic arrangement above-mentioned, may preferably adopt any of the following arrangements.

When a depletion-type transistor is mounted on the semiconductor substrate, each of the impurity diffusion areas of the MIS capacitor comprises (i) a center portion formed by diffusion of impurity injected into that portion of the semiconductor substrate which is located immediately under each of the electrically conductive layers, such injection being made simultaneously with the injection of impurity into the channel area of the depletion-type transistor, and (ii) lateral portions formed by diffusion of impurity injected into those portions of the semiconductor substrate which are located at both lateral sides of the center portion, such injection being made simultaneously with the injection of impurity into the source/drain areas of the MIS transistor. It is therefore possible, in a standard transistor production, to increase the impurity concentration in the impurity diffusion areas of the MIS capacitor. This further improves the MIS capacitor in voltage dependency of a capacity value.

The electrically conductive layers of the MIS capacitor and the gate electrode of the MIS transistor may be formed by silicon oxide layers which have been simultaneously formed. It is therefore possible to form the MIS capacitor and the MIS transistor merely by using a single polysilicon layer. This greatly reduces the production cost as compared with a semiconductor device requiring two polysilicon layers.

The present invention also provides a method of producing a semiconductor device on which mounted are a MIS capacitor having the basic arrangement above-mentioned and a MIS transistor. This semiconductor device producing method comprises: a step of simultaneously depositing silicon oxide layers adapted to serve as a gate insulator layer and first and second capacity insulator layers, such deposition being made on a semiconductor substrate at an area thereof where a MIS capacitor is to be formed and at an area thereof where a MIS transistor is to be formed; a step of introducing impurity under at least those areas of the silicon oxide layers which will serve as the capacity insulator layers of the MIS capacitor, thus forming first and second impurity diffusion areas of the MIS capacitor; a step of depositing an electrically conductive-substance on the silicon oxide layers, thus simultaneously forming a gate electrode of the MIS transistor and first and second electrically conductive layers serving of the MIS capacitor; a step of forming a first wiring line which connects the first electrically conductive layer of the MIS capacitor to the second impurity diffusion area of the MIS capacitor; and a step of forming a second wiring line which connects the second electrically conductive layer of the MIS capacitor to the first impurity diffusion area of the MIS capacitor.

According to the method above-mentioned, there can be obtained the basic MIS capacitor structure above-mentioned, together with the MIS transistor. In particular, there can be obtained a MIS capacitor excellent in characteristics in which the electric charge accumulating member is formed by the silicon oxide layer simultaneously formed with the silicon oxide layer which forms the gate insulator layer of the MIS transistor.

In the basic semiconductor device producing method above-mentioned, any of the following preferable steps may be selected with the same object of selecting any of the preferable structures in the arrangement of the semiconductor device above-mentioned.

The step of forming the impurity diffusion areas of the MIS capacitor is divided into (i) a substep of introducing impurity into areas immediately under the electrically conductive layers and (ii) a substep of introducing impurity into areas which are located under and at lateral sides of the electrically conductive layers. The substep of introducing impurity into areas which are located under and at lateral sides of the electrically conductive layers, is carried out such that the impurity is introduced into the semiconductor substrate with the gate electrode of the MIS transistor and the first and second electrically conductive layers of the MIS capacitor serving as masks, and this substep is carried out simultaneously with a step of introducing impurity into the source/drain areas of the MIS transistor.

The semiconductor device producing method may further comprise a step of injecting impurity ions into a channel area of a depletion-type transistor, and the substep of introducing impurity into areas which are located immediately under the electrically conductive layers, may be carried out simultaneously with the injection of impurity ions into the channel area of the depletion-type transistor.

Polysilicon may be deposited at the step of depositing the electrically conductive substance on the silicon oxide layers.

DETAILED DESCRIPTION OF PREFERRED EMBODIMENTS (First Embodiment)

Figure 1:
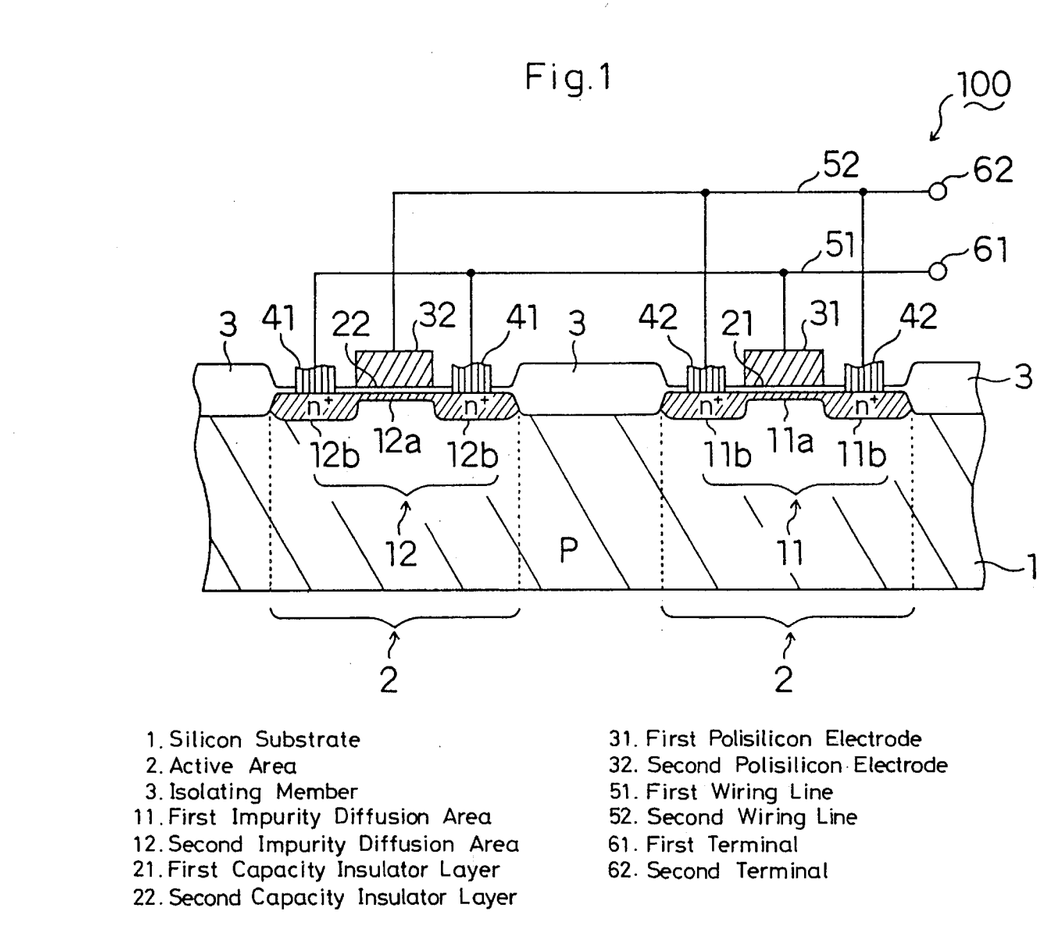
FIG. 1 is a section view of an example of a MIS capacitor according to a first embodiment of the present invention.

The following description will discuss a first embodiment of the present invention with reference to FIG. 1. As shown in FIG. 1, active areas 2 are formed, as partitioned by an element isolating member 3, on a silicon substrate 1 into which P-type impurity has been introduced. In the two active areas 2 shown in FIG. 1, there is formed a MIS capacitor 100 having the following component elements.

In the two active areas 2 in FIG. 1, there are shown first and second center impurity diffusion areas 11a, 12a formed as doped with N-type impurity of which concentration is slightly high, these areas 11a, 12a being formed in the vicinity of the surface of the silicon substrate 1 substantially at the centers of the active areas 2. There are also shown first and second capacity insulator layers 21, 22, each made of a silicon oxide layer, formed on the first and second center impurity diffusion areas 11a, 12a, respectively. First and second polysilicon electrodes 31, 32 are formed on the first and second capacity insulator layers 21, 22 by deposition of a polysilicon layer thereon. Lateral impurity diffusion areas 11b, 12b are formed as doped with N-type impurity in the silicon substrate 1. Two lateral impurity diffusion areas 11b are formed at the both lateral sides of the first polysilicon electrode 31, while two lateral impurity diffusion areas 12b are formed at the both lateral sides of the second polysilicon electrode 32.

The MIS capacitor 100 according to the present invention has an arrangement in which two capacitors are connected in parallel with each other. Generally, a capacitor is formed by two opposite electrodes and an electric charge accumulating member therebetween.

Each of the capacity insulator layers 21, 22 is a part on which electric charge is accumulated, and serves as an electric charge accumulating member of each capacitor. Each of the polysilicon electrodes 31, 32 serves as an electrode of each capacitor. The first center impurity diffusion area 11a and the two first lateral impurity diffusion areas 11b, form a first impurity diffusion area 11 which serves as an electrode of a capacitor. Likewise, the second center impurity diffusion area 12a and the two second lateral impurity diffusion areas 12b, form a second impurity diffusion area 12 which serves as an electrode of a capacitor.

The first polysilicon electrodes 31 and the second impurity diffusion area 12 are connected to a first terminal 61 through a common first wiring line 51. The second polysilycon electrode 32 and the first impurity diffusion area 11 are connected to a second terminal 62 through a common second wiring line 52. The first and second terminals 61, 62 are connected to an analog circuit (not shown) mounted on the silicon substrate 1.

The first and second wiring lines 51, 52 are contacted with the respective lateral impurity diffusion areas 11b, 12b through respective first and second contact members 41, 42. In actuality, the MIS capacitor has interlaminar insulator layers and the like, in addition to the members shown in FIG.

1. For easy understanding, however, the illustration of all upper members is omitted in FIG. 1.

In the MIS capacitor of the present invention formed by connecting two capacitors in parallel with each other, one electrode is formed by the first polysilicon electrode 31 and the second impurity diffusion area 12, the other electrode is formed by the second polysilycon electrode 32 and the first impurity diffusion area 11, and the electric charge accumulating member is formed by the first and second capacity insulator layers 21, 22.

The structure of the MIS capacitor 100 as shown in FIG. 1, can be readily formed by the following production steps (which will be discussed in detail together with steps of producing a MIS transistor in a third embodiment of the present invention). For example, the silicon substrate i is divided, at the surface area thereof, into a number of active areas 2 by the element isolating member 3, and thermal oxide layers are formed on the surface portions of the silicon substrate 1 in the active areas 2. Then, ions of N-type impurity are injected into the silicon substrate 1 in the active areas 2, thereby to form the first and second center impurity diffusion areas 11a, 12a. After the thermal oxide layers have been removed, the first and second capacity. Insulator layers 21, 22 are formed, and a polysilicon layer is deposited thereon and then subjected to patterning, thus forming the first and second polysilicon electrodes 31, 32. With the first and second polysilicon electrodes 31, 32 serving as masks, ions of N-type impurity are injected to form the first and second lateral impurity diffusion areas 11b, 12b. Thereafter, upper members such as interlaminar insulator layers and the like are successively formed, and there are formed the first and second contact members 41, 42 which pass through the upper members thus formed and which come in contact with the lateral impurity diffusion areas 11b, 12b. At the same time, the first and second wiring lines 51, 52 are formed.

Figure 7:
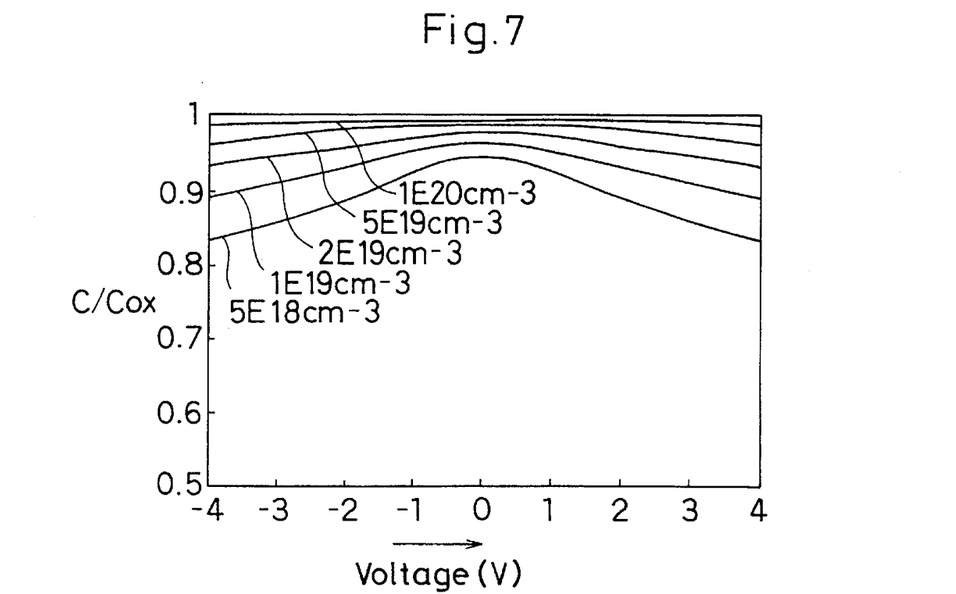
FIG. 7 is a characteristic view illustrating the voltage dependency of a capacity value of a MIS capacitor according to the present invention.

The following will discuss the characteristics of the MIS capacitor 100 according to the first embodiment. FIG. 7 shows the voltage dependency of a capacity value in the MIS capacitor 100, as measured-under conditions similar to those in FIG. 8 mentioned earlier. However, a voltage applied to a polysilicon electrode refers to a voltage applied to any of the polysilicon electrodes, for example the first polysilicon electrode 31. Further, the data shown in FIG. 7 are those obtained at the time when the injection of impurity ions in the first and second center impurity diffusion areas 11a, 12a, is effected simultaneously with the ion injection into a depletion-type transistor. FIG. 7 shows the voltage dependency of a capacity value at the time when the impurity concentration in the first and second center impurity diffusion areas 11a, 12a underwent a change from 1E18 cm$^{-3}$ to 5E19 cm$^{-3}$.

As apparent from the comparison of FIG. 7 with FIG. 8, the effective capacity ratio C/Cox in the MIS capacitor 100 of the first embodiment presents symmetrical changes in a zone where a positive voltage is applied to the polysilicon electrode and in a zone where a negative voltage is applied to the polysilicon electrode. It is also apparent that the amount of change is very small. More specifically, the voltage dependency of a capacity value is very small. For example, when the impurity concentration is equal to 1E19 cm$^{-3}$, the effective capacity ratio C/Cox undergoes a change in the range from about 0.6 to about 1 in the conventional structure, but in the range from about 0.9 to about 0.95 in the structure of the present invention. This is because a voltage applied to one polysilicon electrode and a voltage applied to the other polysilicon electrode have values of which signs are reverse and of which absolute values are equal to each other, so that mutual changes are offset. Thus, by forming such a MIS capacitor, there can be readily obtained a MIS capacitor having characteristics which enable the MIS capacitor to be mounted on an analog circuit. As shown in FIG. 7, with an increase in impurity concentration in the impurity diffusion areas, the voltage dependency of a capacity value is lowered. The voltage dependency of a capacity value obtained at the time when the impurity concentration is in the range from 1 to 2E19 cm$^{-3}$, is acceptable in view of practical use. Such an impurity concentration appears at the time when impurity ions are injected into the channel area of a depletion-type transistor. Accordingly, it is preferable to effect the injection of impurity ions into the center impurity diffusion areas 11a, 12a simultaneously with the ion injection into the channel area of a depletion-type transistor.

In the first embodiment above-mentioned, the first and second capacity insulator layers 21, 22 are formed by silicon oxide layers. It is therefore easy to control such that the insulator layers 21, 22 are uniform in thickness. This not only enhances the precision of a capacity value, but also provokes no increase in area required for the MIS capacitor as done in a capacitor using two metal layers and one polysilicon layer.

In the first embodiment, the MIS capacitor can be formed with the use of only one polysilicon layer and can therefore be greatly reduced in production cost as compared with a generally prevailing capacitor using two polysilicon layers. Further, as compared with a capacitor using two polysilicon layers, the MIS capacitor of the first embodiment can be advantageously reduced in required area to about a half for obtaining the same capacity value.

Figure 2:
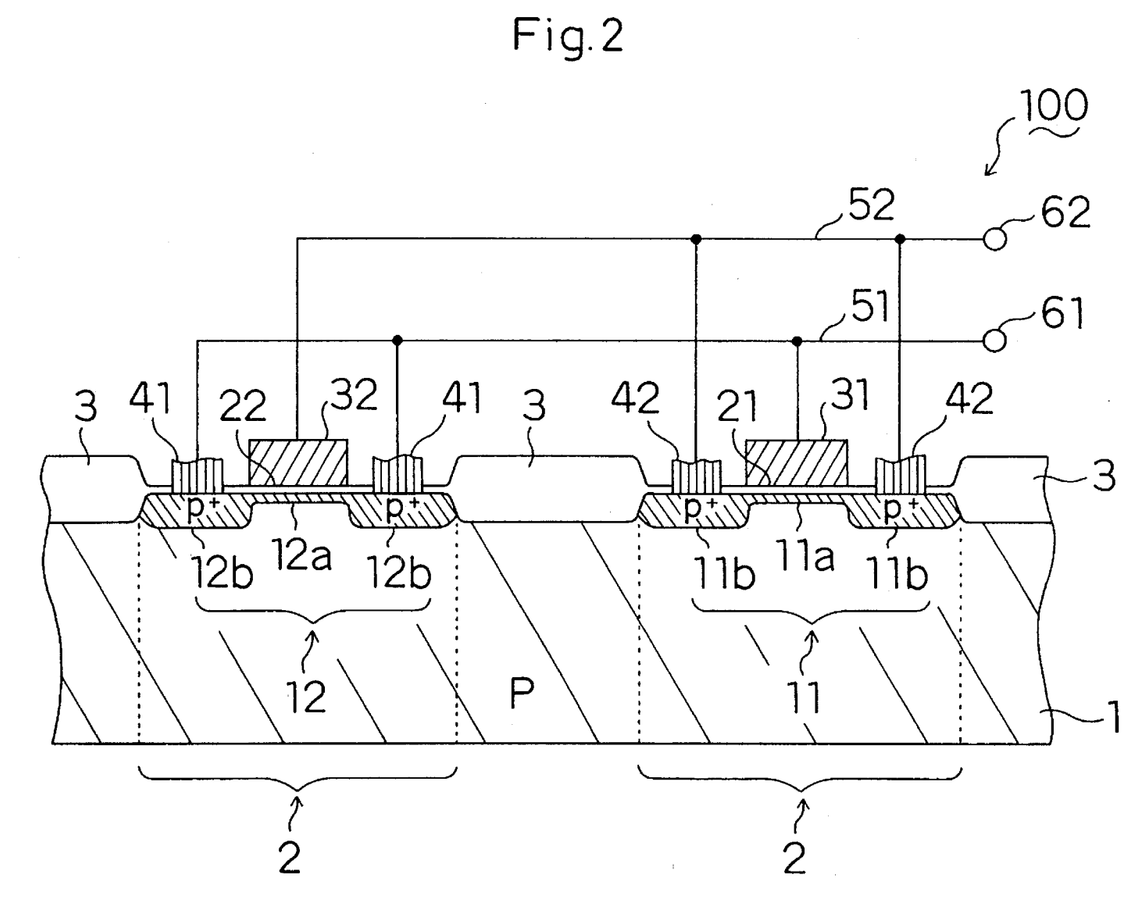
FIG. 2 is a section view of another example of the MIS capacitor according to the first embodiment of the present invention.

In the first embodiment above-mentioned, the first and second impurity diffusion areas 11, 12 are doped with N-type impurity of the type reverse in electrical conduction to the impurity with which the silicon substrate 1 is doped. However, the present invention is not limited to such an embodiment. FIG. 2 shows a sectional structure of a MIS capacitor 100 in which first and second impurity diffusion areas 11, 12 are doped with. P-type impurity. This MIS capacitor 100 produces a basic effect similar to that produced by the MIS capacitor 100 shown in FIG. 1.

Further, in the first embodiment above-mentioned, the first and second impurity diffusion areas 11, 12 are formed by the center impurity diffusion areas 11a, 12a and the lateral impurity diffusion areas 11b, 12b. However, the present invention is not limited to such an arrangement. For example, the active areas 2 may be doped, at suitable portions thereof, with impurity substantially in a uniform concentration, thus forming one impurity diffusion area in each of the active areas 2. However, when center impurity diffusion areas and lateral impurity diffusion areas are formed as done in the first embodiment, there can be formed, without any production step added to steps of producing a MIS transistor, impurity diffusion areas high in concentration, thus forming a MIS capacitor excellent in characteristics. It is therefore possible to produce, with a low cost, a MIS capacitor of which characteristics are excellent and for which required space is small.

(Second Embodiment)

Figure 3:
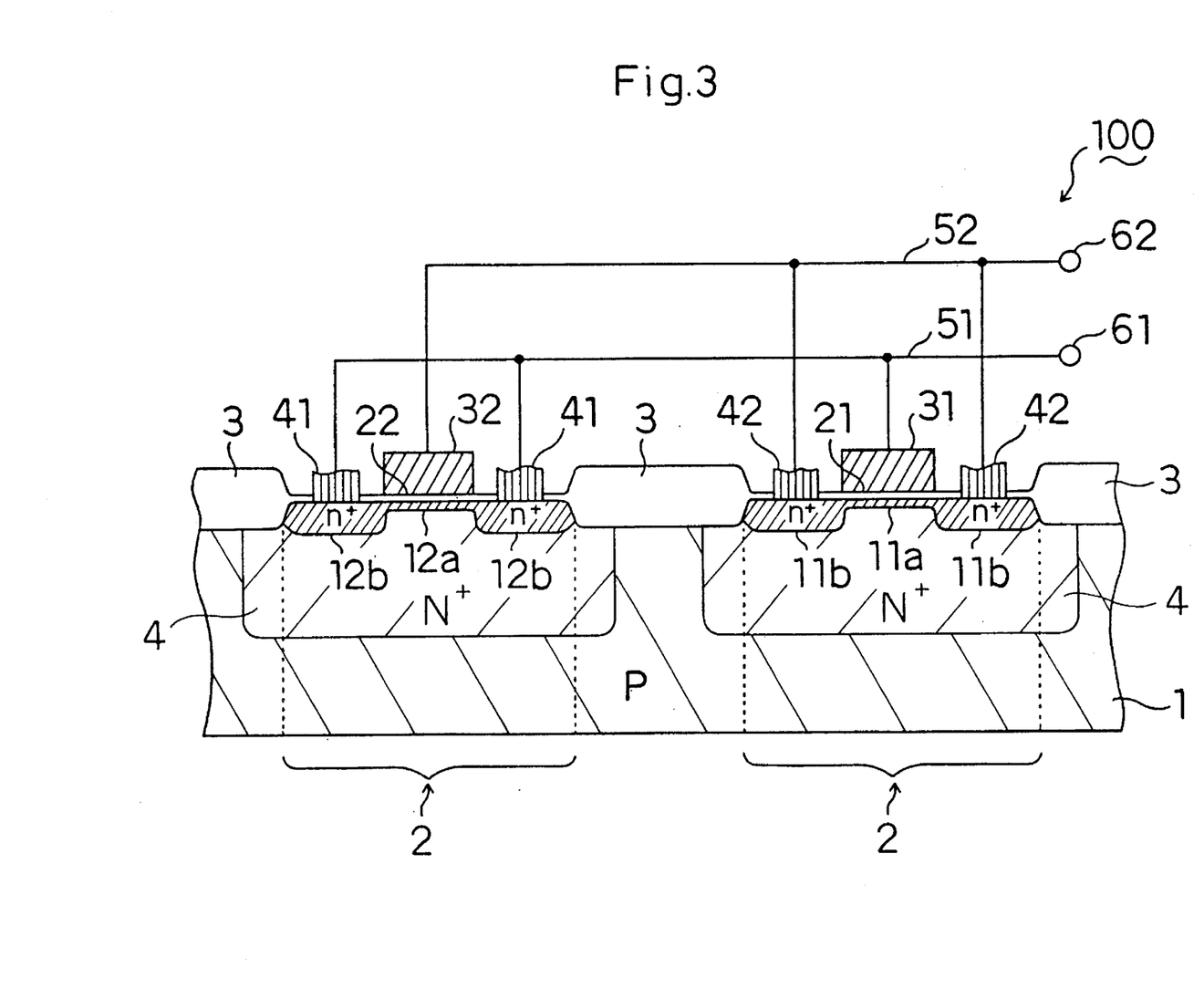
FIG. 3 is a section view of a MIS capacitor according to a second embodiment of the present invention.

The following description will discuss a second embodiment with reference to FIG. 3. Except for the following points, the second embodiment has a basic arrangement similar to that of the first embodiment in FIG. 1. More specifically, N-wells 4 are formed in active areas 2 of a silicon substrate 1 doped with P-type impurity, each N-well 4 being doped, to a predetermined depth thereof, with N-type impurity. Impurity diffusion areas 11a, 11b, 12a, 12b are formed inside of the N-wells 4.

This second embodiment basically produces effects similar to those produced by the first embodiment. Further, the impurity diffusion areas 11a, 11b, 12a, 12b of the MIS capacitor 100 are securely electrically insulated from the silicon substrate 1. Accordingly, even though an element such as a MIS transistor or the like is formed on other area, it is possible to securely prevent the electrical interference of such other element with the MIS capacitor.

(Third Embodiment)

Figure 4A:
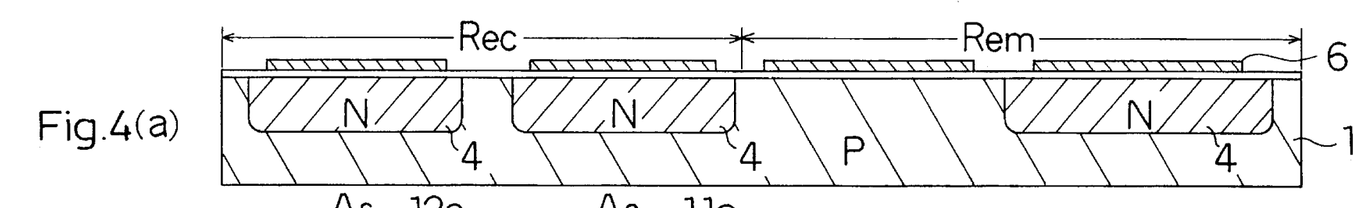
FIG. 4(a) to FIG. 4(d) are section views illustrating changes in structure of a semiconductor device according to a third embodiment of the present invention, such changes taking place in production steps thereof.
Figure 4B:
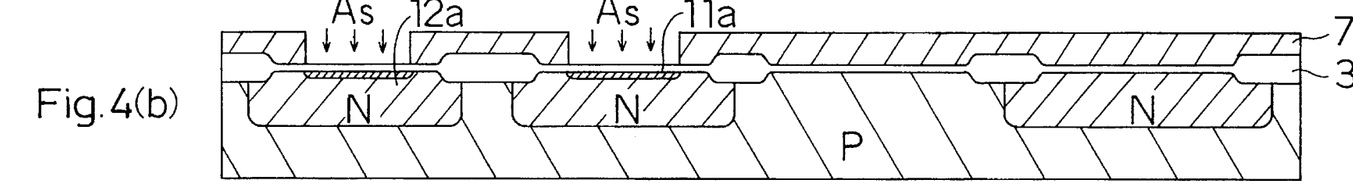
Figure 4C:
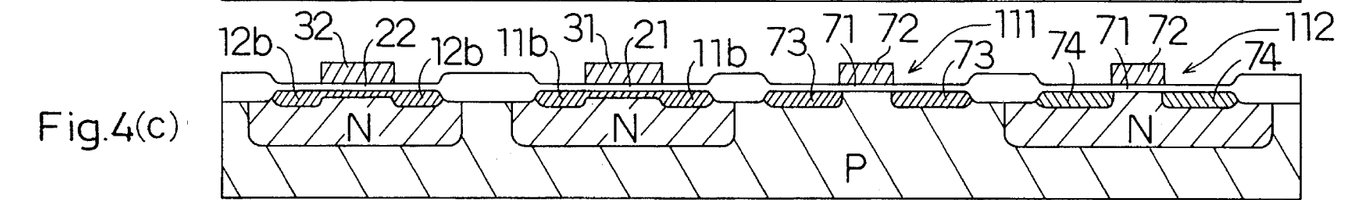
Figure 4D:
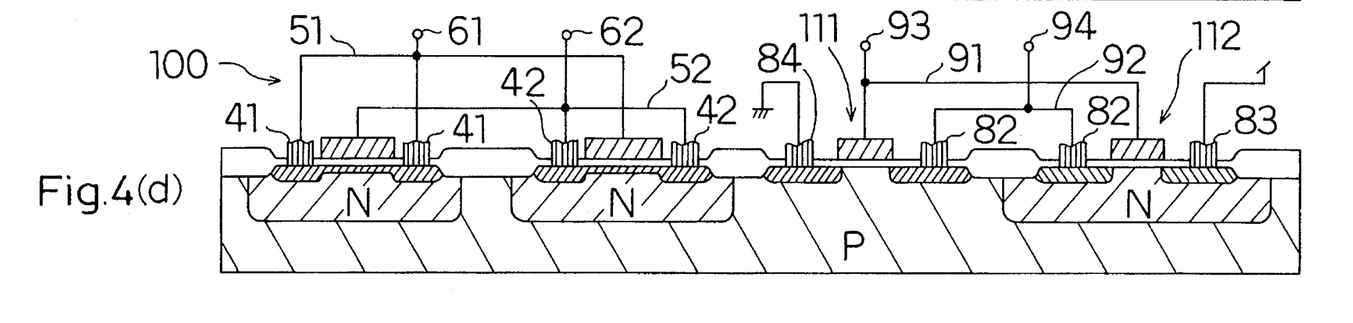
Figure 5:
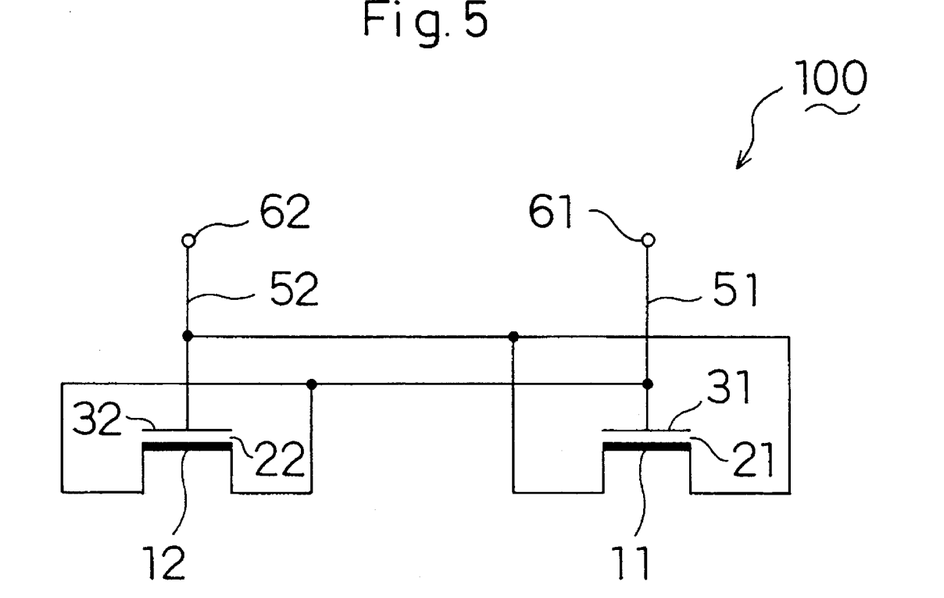
FIG. 5 is an electric circuit diagram of a MIS capacitor according to the third embodiment of the present invention.
Figure 6:
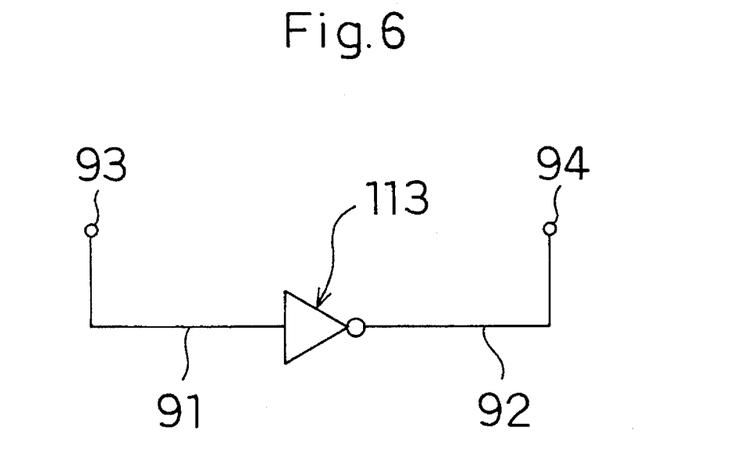
FIG. 6 is an electric circuit diagram of an inverter element according to the third embodiment of the present invention.

The following description will discuss a third embodiment of the present invention with reference to FIG. 4 (a) to (d) and FIGS. 5, 6.

In FIG. 4 (a) to (d), there are shown two areas, i.e., an area Rec on which a MIS capacitor to be mounted on an analog circuit is to be formed (capacitor forming area), and an area Rem on which MIS transistors (an N-channel MIS transistor and a P-channel MIS transistor) mounted on a digital circuit, is to be formed (transistor forming area). In an actual semiconductor device, two areas Rec, Rem are not adjacent to each other as shown in FIG. 4. In this embodiment, however, these two areas are shown as being adjacent to each other for better understanding.

As shown in FIG. 4 (a), N-wells 4 are formed at portions of the surface zone (where active areas will be later formed) of a silicon substrate 1 doped with P-type impurity. A silicon nitride layer is deposited on a silicon oxide layer formed through selective oxidation and is then subjected to patterning, thus forming a nitride layer mask 6 which is opened at portions thereof where an element isolating member 3 is to be formed.

As shown in FIG. 4 (b), after the element isolating member 3 is formed to divide the silicon substrate 1 into a number of active areas, the nitride layer mask 6 is removed and a photomask 7 is formed. This photomask 7 covers the transistor forming area Rem and is opened at zones thereof corresponding to center impurity diffusion areas of the capacitor forming area Rec. Simultaneously with ion injection from above the photomask 7 to channel areas of depletion-type transistors (not shown), ions of As (arsenic) high in concentration are injected, thus forming center impurity diffusion areas 11a, 12a.

As shown in FIG. 4 (c), after the photomask 7 is removed, the silicon oxide layer is once removed and there are formed, at the surface of the silicon substrate 1 in the active areas 2, silicon oxide layers which will serve as capacity insulator layers 21, 22 of the MIS capacitor 100 and also as gate insulator layers 71 of MIS transistors 111, 112. Deposited on the silicon oxide layers is a polysilicon layer, which is then subjected to patterning, thus simultaneously forming polysilicon electrodes 31, 32 of the MIS capacitor 100 and gate electrodes 72 of the MIS transistors 111, 112. With photomasks covering predetermined areas and the electrodes serving as masks, ions of P (phosphorus) are injected, thus simultaneously forming lateral impurity diffusion areas 12b of the MIS capacitor 100 and source/drain areas 73 of the N-channel MIS transistor 111. However, it is noted here that the area where the P-channel MIS transistor 112 is to be formed, is covered with a photomask. Then, there is formed a photomask which covers the capacitor forming area Rec and the area where the N-channel MIS transistor 111 is to be formed. With this photomask and the gate electrode 72 of the P-channel MIS transistor 112 serving as masks, ions of B (boron) are injected to form source/drain areas 74 of the P-channel MIS transistor 112.

Although there is omitted an illustration of subsequent steps of forming layers, interlaminar insulator layers and the like are formed, contact holes are formed and contact members and wiring patterns are formed. Through these steps, as shown in FIG. 4 (d), there are formed in the capacitor forming area Rec (i) a first wiring line 51 which is connected to the first polysilicon electrode 31 and which is connected to the second impurity diffusion area 12 through contact members 41 and (ii) a second wiring line 52 which is connected to the second polysilicon electrode 32 and which is connected to the first impurity diffusion area 11 through contact members 42. Further formed in the transistor forming area Rem (i) a first wiring line 91 which is connected to the gate electrodes 72 of the MIS transistors 111, 112 and (ii) a second wiring line 92 which is connected to the source/drain areas 73, 74 of the MIS transistors 111,112 through contact members 82. These wiring lines 51, 52, 91, 92 are made of the same metal layer (e.g., an aluminum alloy layer). By these two MIS transistors 111, 112 (CMOS transistors), an inverter element 113 is formed between an input terminal 93 and an output terminal 94.

Also shown in FIG. 4 are (i) contact members 83, 84 which are connected from a drain voltage power source and a grounding power source to the source/drain areas 73, 74 of the MIS transistors 111, 112, and (ii) first and second terminals 61, 62 of the MIS capacitor 100.

FIG. 5 shows, in the form of an electric circuit, the MIS capacitor 100 formed through the steps above-mentioned. FIG. 6 shows, in the form of an electric circuit, the inverter element 113 formed by the two MIS transistors 111, 112 (i.e., CMOS transistors).

According to the third embodiment, a MIS capacitor to be mounted on an analog circuit and CMOS transistors and the like to be mounted on a digital circuit, can be formed by a process using one polysilicon layer through the common steps. In other words, a MIS capacitor can be formed through a process using one polysilicon layer which is used in the production of a usual CMOS transistor. Accordingly, as compared with a conventional MIS-capacitor production with a process in which two polysilicon layers are used, the third embodiment can be considerably reduced in cost, i.e., the number of production steps and the production period of time.

In each of the embodiments above-mentioned, the MIS capacitor 100 has two polysilicon electrodes 31, 32, two capacity insulator layers 21, 22, and two impurity diffusion areas 11, 12. However, the present invention should not be limited to such embodiments. For example, each of the elements such as the first polysilicon electrode and the like may be two in number. In such a case, two first polysilicon electrodes and two second impurity diffusion areas may be connected to the first terminal through a common first wiring line, and two second polysilicon electrodes and two first impurity diffusion areas are connected to the second terminal through a common second wiring line. With the arrangement above-mentioned, there may be readily formed a MIS capacitor having a variety of capacity values.

Although not shown, it is also possible to form, on an insulator substrate, a MIS capacitor as shown in each of the embodiments above-mentioned. In such a case, the silicon substrate 1 may be replaced with a layer formed through epitaxial growth on the insulator substrate with other structure being basically the same as the structure shown in the section view of FIG. 1 or 3 for example.

We claim:

1. A MIS capacitor adapted to be interposed between two terminals, i.e., first and second terminals, connected to an electric circuit, comprising:

first and second capacity insulator layers formed on a common semiconductor substrate;

first and second electrically conductive layers respectively formed on said first and second capacity insulator layers:

first and second impurity diffusion areas formed by introducing impurities of the same electrically conductive type, into those portions of said semiconductor substrate which are located under said first and second capacity insulator layers;

a first wiring line which connects said first electrically conductive layer and said second impurity diffusion area to said first terminal; and a second wiring line which connects said second electrically conductive layer and said first impurity diffusion area to said second terminal.

2. A MIS capacitor according to claim 1, wherein there is introduced, into the first and second impurity diffusion areas, impurity of the type reverse in electrical conduction to impurity introduced into the semiconductor substrate.

3. A MIS capacitor according to claim 2, wherein wells are formed in the vicinity of the surface of the semiconductor substrate by introducing impurity thereinto, and the first and second impurity diffusion areas are formed in said wells.

4. A MIS capacitor according to claim 3, wherein the first and second impurity diffusion areas are formed by introducing impurity of which electrically conductive type is the same as that of the impurity of the wells and of which concentration is higher than that of said impurity of said wells.

5. A MIS capacitor according to claims 1, 2, or 3, wherein:

each of the first and second impurity diffusion areas comprises (i) a center portion formed by introduction of impurity into that portion of the semiconductor substrate which is located under each of the electrically conductive layers, and (ii) two lateral portions formed by introduction of impurity into those portions of said semiconductor substrate which are located at both lateral sides of each of said electrically conductive layers; and each of the wiring lines comes in contact with said two lateral portions of each of said first and second impurity diffusion areas.

6. A MIS capacitor according to claims 1, 2, or 3, wherein each of the capacity insulator layers is a silicon oxide layer.

7. A MIS capacitor according to claims 1, 2, or 3, wherein the semiconductor substrate is a P-type semiconductor substrate into which P-type impurity has been introduced.

8. A MIS capacitor according to claims 1, 2, or 3, wherein the semiconductor substrate comprises a semiconductor layer deposited on an insulator layer.

9. A MIS capacitor according to claims 1, 2, or 3, wherein each of the first and second capacity insulator layers, each of the first and second electrically conductive layers and each of the first and second impurity diffusion areas are disposed in the same plural numbers.

10. A semiconductor device comprising:

a MIS capacitor comprising (i) first and second capacity insulator layers formed on a common semiconductor substrate, (ii) first and second electrically conductive layers respectively formed on said first and second capacity insulator layers, (iii) first and second impurity diffusion areas formed by introducing impurity into those portions of said semiconductor substrate which are located under said first and second capacity insulator layers, (iv) a first terminal connected, through a first wiring line, to said first electrically conductive layer and said second impurity diffusion area and (v) a second terminal connected, through a second wiring line, to said second electrically conductive layer and said first impurity diffusion area; and a MIS transistor formed on said semiconductor substrate and having a gate electrode, a gate insulator layer, a channel area and source/drain areas, said capacity insulator layers of said MIS capacitor and said gate insulator layer of said MIS transistor being formed by silicon oxide layers which are simultaneously formed.

11. A semiconductor device according to claim 10 wherein:

a depletion-type transistor is mounted on the semiconductor substrate; and each of the impurity diffusion areas comprises (i) a center portion formed by diffusion of impurity injected into that portion of said semiconductor substrate which is located immediately under each of the electrically conductive layers, said injection being made simultaneously with the injection of impurity into the channel area of said depletion-type transistor, and (ii) lateral portions formed by diffusion of impurity injected into those portions of said semiconductor substrate which are located at both lateral sides of said center portion, said injection being made simultaneously with the injection of impurity into the source/drain areas of the MIS transistor.

12. A semiconductor device according to claim 10 wherein the electrically conductive layers of the MIS capacitor and the gate electrode of the MIS transistor are formed by the same polysilicon layer.

13. A semiconductor device according to claim 9, wherein the electrically conductive layers of the MIS capacitor and the gate electrode of the MIS transistor are formed by the same polysilicon layer.

* * * * *